United States Patent
Hasegawa

(12) 
(10) Patent No.: US 7,901,597 B2
(45) Date of Patent: Mar. 8, 2011

(54) TRANSPARENT CONDUCTIVE FILM, SINTERED BODY, AND THEIR PRODUCTION METHODS

(75) Inventor: Akira Hasegawa, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/376,154

(22) PCT Filed: Aug. 13, 2007

(86) PCT No.: PCT/JP2007/066066
§ 371 (c)(1),
(2), (4) Date: Feb. 3, 2009

(87) PCT Pub. No.: WO2008/023651
PCT Pub. Date: Feb. 28, 2008

(65) Prior Publication Data
US 2009/0315000 A1  Dec. 24, 2009

(30) Foreign Application Priority Data
Aug. 22, 2006  (JP) .................................. 2006-225056

(51) Int. Cl.
*H01B 1/08* (2006.01)
(52) U.S. Cl. ............................................. 252/520.21
(58) Field of Classification Search ............... 252/518.1, 252/520.2, 520.21; 204/192.15
See application file for complete search history.

(56) References Cited

U.S. PATENT DOCUMENTS
2003/0107098 A1   6/2003   Ota et al.
2010/0065424 A1*  3/2010   Takahashi et al. ....... 204/298.13

FOREIGN PATENT DOCUMENTS
EP       1170251 A1       1/2002
JP       2005-179129 A    7/2005
WO       WO97/01853   *   1/1997

OTHER PUBLICATIONS

English trans of JP 2005-179129.*

* cited by examiner

*Primary Examiner* — Mark Kopec
(74) *Attorney, Agent, or Firm* — Sughrue Mion, PLLC

(57) ABSTRACT

The present invention provides a transparent conductive film having high conductivity and a production method therefor. The present invention further provides a sintered body for forming the transparent conductive film and a production method therefor. The transparent conductive film comprises Ga, Ti, and O. The sintered body comprises Ga, Ti, and O. The method for producing a sintered body comprises the steps of: (a) mixing a titanium-containing powder and a gallium-containing powder; and (b) compacting and sintering the obtained mixture.

2 Claims, 4 Drawing Sheets

TRANSPARENT CONDUCTIVE FILM, SINTERED BODY, AND THEIR PRODUCTION METHODS

TECHNICAL FIELD

The present invention relates to a transparent conductive film, a sintered body, and their production methods.

BACKGROUND ART

A transparent conductive film is used in an electrode for a display such as a liquid crystal display, organic EL display, plasma display, an electrode for a solar battery, a heat-reflecting film of a windowpane, an antistatic film, and the like.

As the transparent conductive film, there has been known a film formed using a $Ga_2O_3$ target containing $SnO_2$ (JP-A-2002-93243).

However, the transparent conductive film disclosed in the publication has been insufficient in conductivity.

DISCLOSURE OF THE INVENTION

An object of the present invention is to provide a transparent conductive film having high conductivity and a production method therefor.

Another object of the present invention is to provide a sintered body for forming the transparent conductive film and a production method therefor.

The present inventors have achieved the present invention as a result of their dedicated study to solve the foregoing problem.

That is, the present invention provides the following <1> to <11>.

<1> A transparent conductive film comprising Ga, Ti, and O.
<2> The transparent conductive film of <1>, having a Ti content of not less than 0.02 and not more than 0.98 relative to the total content of Ga and Ti in terms of mole.
<3> A sintered body comprising Ga, Ti, and O.
<4> The sintered body of <3>, having a Ti content of not less than 0.02 and not more than 0.98 relative to the total content of Ga and Ti in terms of mole.
<5> A method for producing the sintered body comprising the steps of:
   (a) mixing a titanium-containing powder and a gallium-containing powder; and
   (b) compacting and sintering the obtained mixture.
<6> The method of <5>, wherein the titanium-containing powder comprises metal titanium and titanium oxide.
<7> The method of <5> or <6>, wherein the sintered body has a Ti content of not less than 0.02 and not more than 0.98 relative to the total content of Ga and Ti in terms of mole.
<8> A method for producing a transparent conductive film, comprising the step of:
   (c) forming a film using, as a target, the sintered body of <3> or <4>, or the sintered body obtained by the method of any one of <5> to <9>.
<9> The method of <8>, wherein forming is carried out by a method selected from among pulsed laser deposition, sputtering, ion plating, and EB deposition.
<10> The method of <8> or <9>, wherein forming is carried out under an atmosphere having an oxygen partial pressure of less than 1 Pa.

MODE FOR CARRYING OUT THE INVENTION

Figure 1:
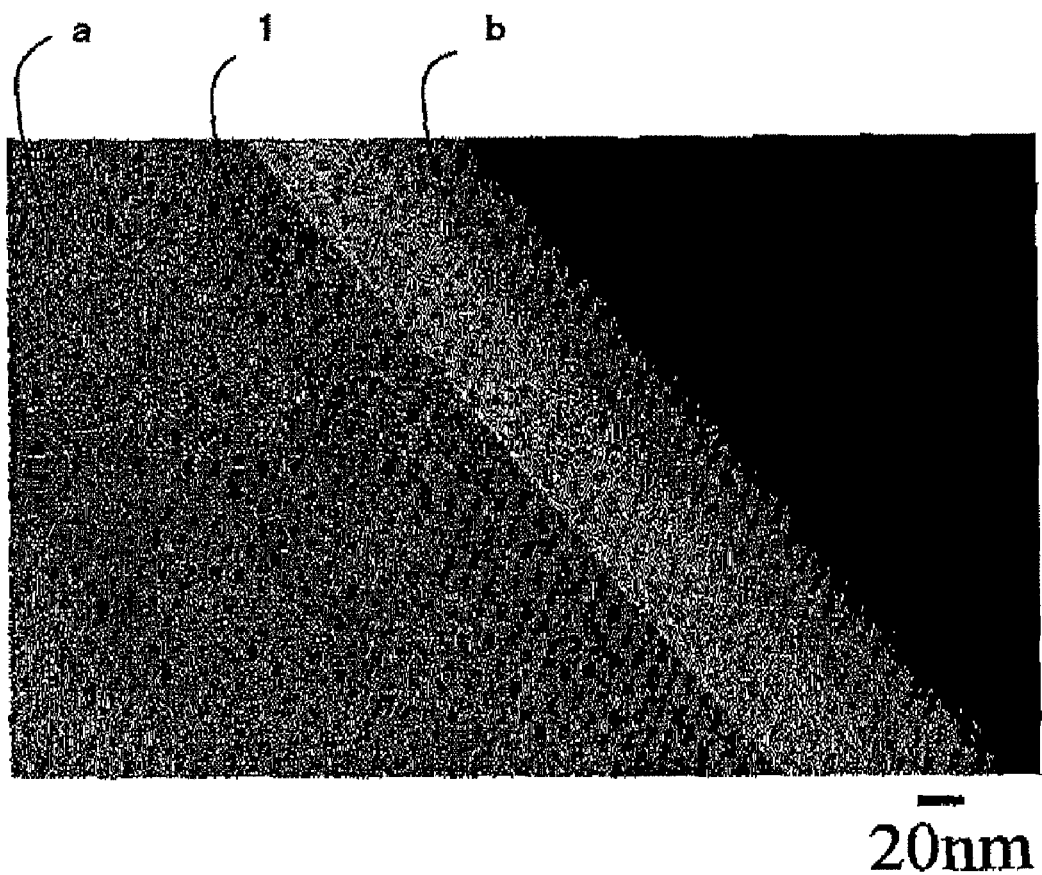
FIG. 1 shows a cross sectional TEM image of a transparent conductive film 1.
Figure 2:
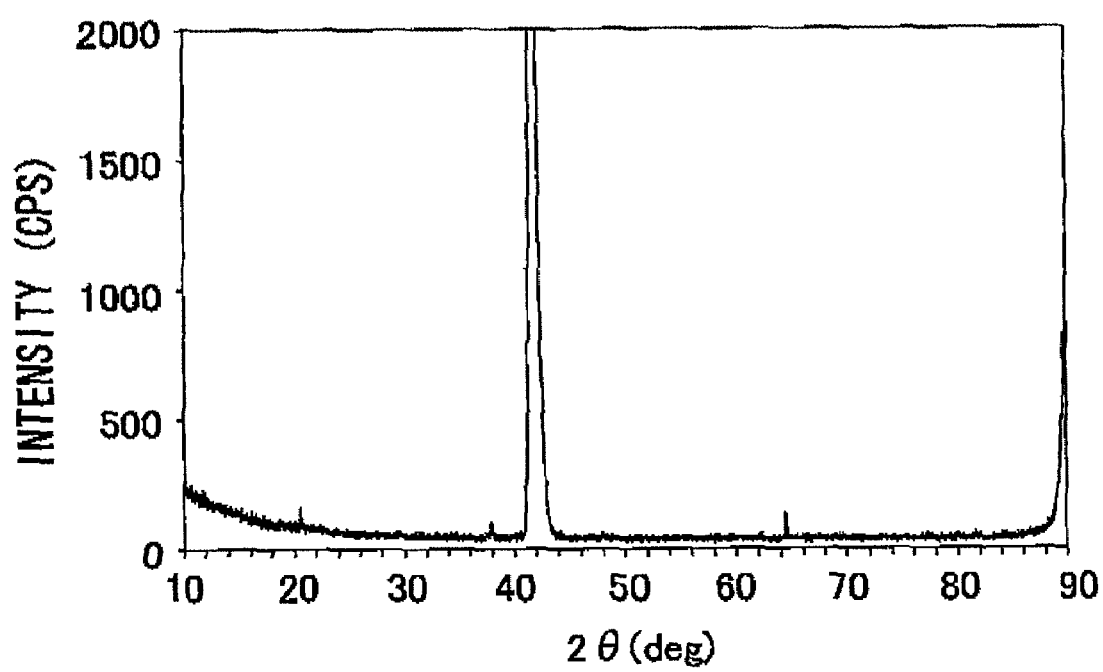
FIG. 2 shows an X-ray diffraction pattern of a sapphire substrate.
Figure 3:
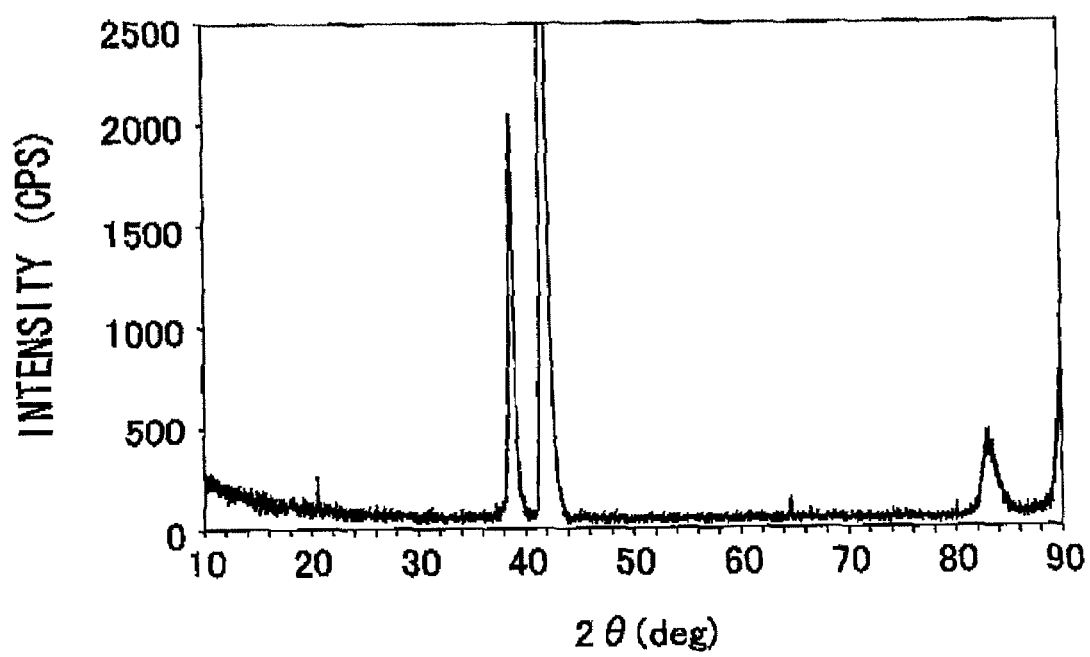
FIG. 3 shows an X-ray diffraction pattern of a transparent conductive film 1 formed on a sapphire substrate.
Figure 4:
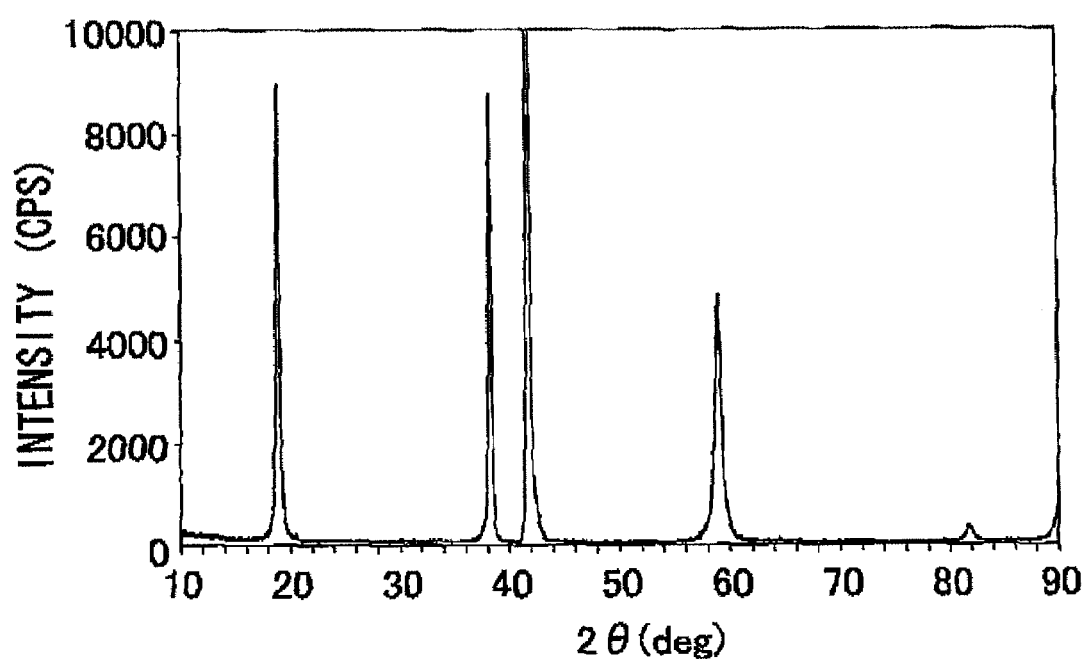
FIG. 4 shows an X-ray diffraction pattern of a film 5 formed on a sapphire substrate.

A transparent conductive film of the present invention contains gallium (Ga), titanium (Ti), and oxygen (O). Usually the transparent conductive film consists essentially of Ga, Ti, and O. The transparent conductive film has high conductivity and is transparent.

In order to increase the conductivity, the transparent conductive film has a Ti content of preferably not less than 0.02 and not more than 0.98, and more preferably not less than 0.10 and not more than 0.95 relative to the total content of Ga and Ti in terms of mole.

In addition, the transparent conductive film may contain a dopant element without impairing the effect of the present invention. Examples of the dopant element include Sn, Ge, Si, Zr, Hf, V, Nb, Ta, As, Sb, Bi, Cr, Mo, and W. The dopant element is usually substituted for a part of Ga and/or Ti which are elements constituting the transparent conductive film. The transparent conductive film has a dopant element in a ratio of usually less than about 1% relative to the molar content of Ga and/or Ti.

The transparent conductive film may be produced by, e.g., a method including the step of forming a film on a substrate using a sintered body containing Ga, Ti, and O as a target. The sintered body may be appropriately selected in accordance with the composition, that is Ga/Ti ratio, of the transparent conductive film. The sintered body has a Ti content of preferably not less than 0.02 and not more than 0.98, and more preferably not less than 0.10 and not more than 0.95 relative to the total content of Ga and Ti in terms of mole.

The sintered body may be prepared by, e.g., a method including the steps of:
   (a) mixing a titanium-containing powder and a gallium-containing powder, and
   (b) compacting and sintering the obtained mixture.

The titanium-containing powder contains, e.g., metal titanium or titanium oxide, and preferably contains both of them. The titanium-containing powder has a Ti content of preferably not less than 99% by weight relative to all metal elements contained in the powder.

The gallium-containing powder contains, e.g., metal gallium or gallium oxide. The gallium-containing powder has a Ga content of preferably not less than 99% by weight relative to all metal elements contained in the powder.

Mixing in the step (a) may be carried out by selecting the amount ratio of the titanium-containing powder to the gallium-containing powder in accordance with the composition, that is Ga/Ti ratio, of the transparent conductive film to be obtained, and may be carried out by weighing the titanium-containing powder and the gallium-containing powder such that, e.g., the molar amount of Ti relative to the total molar amount of Ga and Ti is not less than 0.02 and not more than 0.98, and preferably not less than 0.10 and not more than 0.95. Mixing may be carried out in either dry or wet mode. Mixing may be carried out using, e.g., a ball mill, vibration mill, attritor, Dyno mill, or dynamic mill.

The mixture obtained in the step (a) may be subjected to a step such as drying, calcination, pulverizing, or a combination of these steps. The drying step may be carried out by, e.g., heat drying, vacuum drying, or freeze drying. The calcination step may be carried out by a method in which the mixture is held at a temperature lower than a sintering temperature described later. The mixture, or the mixture subjected to the steps described above may be mixed with an additive such as a binder, dispersant, and lubricant.

Compacting in the step (b) may be carried out by, e.g., uniaxial pressing or cold isostatic pressing (CIP). Compacting may be carried out by a combined method of uniaxial pressing and CIP. For example the uniaxial pressing and the successive CIP may be carried out. Compacting may be carried out under conditions of pressure: 100 to 3000 kg/cm$^2$, and shape of a green body: disk or square plate. The obtained green body may be formed by cutting, polishing, or the like as necessary so that the size thereof is adjusted.

Sintering in the step (b) may be carried out under conditions of the atmosphere of an inert gas, the maximum reachable temperature of not less than 900° C. and not more than 1700° C., and a sintering time of 0.5 to 100 hours. The inert gas does not substantially contain oxygen, and is a gas, e.g., supplied from a gas cylinder containing a N$_2$ gas having a purity of not less than 99.995% or a gas cylinder containing an Ar gas having the purity of not less than 99.995%. Wintering may be usually carried out by a method in which the green body is placed in a sintering furnace and the inert gas is introduced into the sintering furnace. The sintering furnace may be either an electric furnace or a gas furnace. The obtained sintered body may be subjected to cutting, polishing, or the like as necessary so that the size thereof is adjusted.

In the step (b), compacting and sintering may be separately and individually carried out, or compacting and sintering may be simultaneously carried out by hot pressing or hot isostatic pressing (HIP).

Forming may be carried out by, e.g., a pulsed laser deposition, sputtering, ion plating, or EB deposition. Forming is usually carried out in a chamber and an oxygen partial pressure in the chamber is preferably less than 1 Pa. The temperature of a substrate is usually in the range from room temperature (25° C.) to 1500° C., and preferably from room temperature (25° C.) to 1100° C. From the viewpoint of availability of a film forming apparatus, it is preferable to use the pulsed laser deposition or the sputtering.

The pulsed laser deposition may be carried out by setting the pressure of the atmosphere in the chamber to not more than 10$^{-3}$ Pa, or introducing a gas such as an oxygen gas into the chamber. The oxygen partial pressure of the gas introduced into the chamber is preferably less than 1 Pa.

Sputtering may be carried out by setting the pressure of the atmosphere in the chamber to about 0.1 to 10 Pa, and introducing an argon gas containing 0 to 10% by volume of the oxygen gas into the chamber. The oxygen partial pressure of the gas to be introduced is preferably less than 1 Pa.

In the EB deposition, forming may be carried out using the sintered body, or by preparing an evaporation cell for each element constituting the transparent conductive film and irradiating a substrate. The composition of the transparent conductive film may be changed by adjusting the irradiation dose.

The substrate is made of, e.g., glass, quartz glass, or plastic. When the transparent conductive film is used as a transparent electrode, the substrate is preferably transparent. The substrate may be crystalline. A glass substrate is preferable since the glass substrate having a large area is available. On the other hand, the glass substrate has a softening point of not relatively high, and when forming is carried out at a temperature of not less than 500° C., the glass substrate is not the most preferable one. The quartz glass as the crystalline substrate has high softening point so that the quartz glass is suitable when forming is carried out by heating up to the temperature of about 1200° C. The crystalline substrate may be made of Al$_2$O$_3$ (sapphire), MgO, YSZ (Y$_2$O$_3$—ZrO$_2$), CaF$_2$, or SrTiO$_3$.

The transparent conductive film may also be produced by a method including the step of forming a film on a substrate without a target. Examples of the method include CVD, MOCVD, spray pyrolysis, and sol-gel process. When the CVD or the MOCVD is used, forming may be carried out by preparing a gas piping for each metal element constituting the transparent conductive film and introducing the gas into the chamber. The composition of the transparent conductive film may be changed by adjusting the feed rate of gas to be introduced.

EXAMPLE

The present invention will be described in detail in accordance with examples. However, the scope of the present invention is not limited to the examples.

Example 1

Titanium oxide powder (TiO$_2$, manufactured by Wako Pure Chemical Industries, Ltd., special grade), metal titanium powder (Ti, manufactured by Kojundo Chemical Laboratory Co., Ltd., the purity of 99.99%), and gallium oxide powder (Ga$_2$O$_3$, manufactured by Tama Chemicals Co., Ltd.) were weighed and mixed so as to provide a molar ratio satisfying TiO$_2$:Ti:Ga$_2$O$_3$=1:1:1. The molar ratio of Ti to Ga was 1:1. The obtained mixture is compacted into a disk at the pressure of 500 kg/cm$^2$ by uniaxial die-pressing, and the disk was compacted at a pressure of 1800 kg/cm$^2$ by cold isostatic pressing to obtain a green body. The green body was sintered under a nitrogen gas atmosphere having normal pressure at 1400° C. for 48 hours to obtain a sintered body. A target having a diameter of 20 mm was prepared from the sintered body. The target was installed in a pulsed laser deposition apparatus (PS-2000, manufactured by Seinan Industries, Co., Ltd.). The sapphire substrate was placed in the pulsed laser deposition apparatus in opposing relation to the target, and was heated up to 800° C. with a heater. A KrF excimer laser (laser irradiator Comex 205 type, manufactured by Lambda physics, Inc.) was radiated to the target to form a transparent conductive film 1 on the sapphire substrate. The pulsed laser deposition to form the film was carried out under conditions of a formation time of 60 minutes, a pressure of 10$^{-3}$ Pa, a substrate temperature of 800° C., a laser output of 150 mJ, and a pulse frequency of 20 Hz.

The surface resistance, that is sheet resistance, of the transparent conductive film 1 was determined by a four-probe method according to JIS R 1637 using Loresta-AP manufactured by Mitsubishi Chemical Corporation.

The transparent conductive film 1 had a surface resistance of 5.2×10$^2$ Ω/□. The transparent conductive film 1 was treated using a focused ion beam (FIB) apparatus, and a cross section of the film was observed using TEM to determine a film thickness. The film thickness was 50 nm. FIG. 1 showed a cross sectional TEM image of the transparent conductive film 1. In the image, a indicated the sapphire substrate and c indicated a protective layer. The resistivity of the transparent conductive film 1 was calculated from the surface resistance and the film thickness using the equation (1). The resistivity was 2.6×10$^{-3}$ Ωcm. The transparent conductive film 1 was a film having high conductivity.

$$\text{Resistivity (Ωcm)=surface resistance (Ω/□)×film thickness (cm)} \quad (1)$$

The light transmittance of the sapphire substrate formed with the transparent conductive film 1 was determined by a method according to JIS R 1635 using a visible spectrophotometer (MCPD-1000 manufactured by Otsuka Electronics Co., Ltd.). The sapphire substrate formed with the transparent conductive film 1 had an average light transmittance in the wavelength range from 380 nm to 780 nm of 60%. The sapphire substrate before forming had an average light transmittance in the wavelength range from 380 nm to 780 nm of 87%.

Example 2

A transparent conductive film 2 was obtained by carrying out the same operations as those in Example 1 except the pulsed laser deposition conditions of the film formation time of 30 minutes, the pressure of $10^{-3}$ Pa, the substrate temperature of 800° C., the laser output of 150 mJ, and the pulse frequency of 20 Hz.

The transparent conductive film 2 had a surface resistance of $4.75\times10^3$ Ω/□, a film thickness of 25 nm, and a resistivity of $1.2\times10^{-2}$ Ω/cm. The transparent conductive film 2 was a film having high conductivity. The sapphire substrate formed with the transparent conductive film 2 had an average light transmittance in the wavelength range from 380 nm to 780 nm of 80%.

Example 3

A sintered body was obtained by carrying out the same operations as those in Example 1. A target having a diameter of 50 mm was prepared from the sintered body. The target was installed in a sputtering apparatus (E-200S, manufactured by Canon ANELVA Engineering Corporation). The sapphire substrate was placed in the sputtering apparatus in opposing relation to the target and heated up to 800° C. with a lamp heater. A transparent conductive film 3 was formed on the sapphire substrate under the sputtering conditions as follows.
film formation time: 55 minutes,
pressure of an Ar atmosphere: 0.5 Pa,
substrate temperature: 800° C., and
power input in RF sputtering: 50 W.

The transparent conductive film 3 had a surface resistance of $8.9\times10^2$ Ω/□, a film thickness of about 100 nm, and a resistivity of $8.9\times10^{-3}$ Ω/cm. The film thickness was determined using a contact-type film thickness meter. The transparent conductive film 3 was a film having high conductivity. The sapphire substrate formed with the transparent conductive film 3 had an average light transmittance in the wavelength range from 380 nm to 780 nm of 25%.

Example 4

Titanium dioxide powder ($TiO_2$, manufactured by Wako Pure Chemical Industries, Ltd., special grade) and gallium oxide powder ($Ga_2O_3$, manufactured by Tama Chemicals Co., Ltd.) were weighed and mixed so as to provide the molar ratio satisfying $TiO_2:Ga_2O_3=2:1$. The molar ratio of Ti to Ga was 1:1. The obtained mixture was compacted into a disk at the pressure of 500 kg/cm² by uniaxial die-pressing, and the disk was compacted at a pressure of 1800 kg/cm² by cold isostatic pressing to obtain a green body. The green body was sintered under a nitrogen gas atmosphere having normal pressure at 1400° C. for 3 hours to obtain a sintered body. The sintered body was installed as the target in the sputtering apparatus (E-200S, manufactured by Canon ANELVA Engineering Corporation). In the sputtering apparatus, the sapphire substrate was placed in opposing relation to the target, and was heated up to 800° C. with the lamp heater. A transparent conductive film 4 was formed on the sapphire substrate under the sputtering conditions as follows:
film formation time: 50 minutes,
pressure of the Ar atmosphere: 0.5 Pa,
substrate temperature: 800° C., and
power input in RF sputtering: 50 W.

The transparent conductive film 4 had a surface resistance of $1.4\times10^3$ Ω/□, a film thickness of about 100 nm, and a resistivity of $1.4\times10^{-2}$ Ωcm. The film thickness was determined using a contact-type film thickness meter.

The transparent conductive film 4 was a film having high conductivity. The sapphire substrate formed with the transparent conductive film 4 had an average light transmittance in the wavelength range from 380 nm to 780 nm of 60%.

Comparative Example 1

Gallium oxide powder ($Ga_2O_3$, manufactured by Tama Chemicals Co., Ltd.) and tin oxide powder ($SnO_2$, manufactured by Kojundo Chemical Laboratory Co., Ltd., the purity of 99.99%) were weighed and mixed so as to provide the molar ratio satisfying $Ga_2O_3:SnO_2=47.5:5$. The molar ratio of Ga to Sn was 95:5. The obtained mixture was compacted into a disk at a pressure of 500 kg/cm² by uniaxial die-pressing, and the disk was compacted at a pressure of 1800 kg/cm² by cold isostatic pressing to obtain a green body. The green body was sintered under an oxygen gas atmosphere having normal pressure at 1600° C. for 3 hours to obtain a sintered body. A target having a diameter of 20 mm was prepared from the sintered body. The target was installed in a pulsed laser deposition apparatus (PS-2000, manufactured by Seinan Industries, Co., Ltd.). The sapphire substrate was placed in the pulsed laser deposition apparatus in opposing relation to the target, and was heated up to 800° C. with the heater. A KrF excimer laser (laser irradiator Comex 205 type, manufactured by Lambda physics, Inc.) was radiated to the target to form a film 5 on the sapphire substrate. The conditions of the pulsed laser deposition to form a film were as follows.
formation time: 60 minutes,
pressure: 10 Pa,
substrate temperature: 800° C.,
laser output: 150 mJ, and
pulse frequency: 20 Hz.

The film 5 had a surface resistance of $3.27\times10^{12}$ Ω/□, a film thickness of about 150 nm, and a resistivity of $4.9\times10^7$ Ωcm. The film thickness was determined using a contact-type film thickness meter. The sapphire substrate formed with the film 5 had an average light transmittance in the wavelength range from 380 nm to 780 nm of 86.6%.

INDUSTRIAL APPLICABILITY

The transparent conductive film of the present invention has high conductivity, and is suitably used in an electrode for a display such as a liquid crystal display, organic EL display, flexible display, plasma display, an electrode for a solar battery, a heat-reflecting film of a windowpane, an antistatic film, and the like.

The invention claimed is:

1. A transparent conductive film consisting of Ga, Ti, and O,
   wherein the film has a Ti content of not less than 0.10 and not more than 0.95 relative to the total content of Ga and Ti in terms of mole.

2. A transparent conductive film consisting of Ga, Ti, 0 and a dopant element in a ratio of less than 1% relative to the molar content of Ga and Ti,
   wherein the film has a Ti content of not less than 0.10 and not more than 0.95 relative to the total content of Ga and Ti in terms of mole.

* * * * *

UNITED STATES PATENT AND TRADEMARK OFFICE
CERTIFICATE OF CORRECTION

PATENT NO. : 7,901,597 B2
APPLICATION NO. : 12/376154
DATED : March 8, 2011
INVENTOR(S) : Akira Hasegawa It is certified that error appears in the above-identified patent and that said Letters Patent is hereby corrected as shown below:

Col. 6, Lines 56-62 Claim 2 is corrected

2. A transparent conductive film consisting of Ga, Ti, [[0]]O and a dopant element in a ratio of less than 1% relative to the molar content of Ga and Ti, wherein the film has a Ti content of not less than 0.10 and not more than 0.95 relative to the total content of Ga and Ti in terms of mole.

Signed and Sealed this
Nineteenth Day of July, 2011

David J. Kappos
*Director of the United States Patent and Trademark Office*